United States Patent [19]
Ryu

[11] Patent Number: 5,995,434
[45] Date of Patent: Nov. 30, 1999

[54] DYNAMIC RANDOM ACCESS MEMORY DEVICE HAVING A SELF-REFRESH MODE

[75] Inventor: Hoon Ryu, Kyunggi-do, Rep. of Korea

[73] Assignee: Samsung Electronics Co., Ltd., Suwon, Rep. of Korea

[21] Appl. No.: 09/095,931

[22] Filed: Jun. 12, 1998

[30] Foreign Application Priority Data

Jun. 25, 1997 [KR] Rep. of Korea ...................... 97-27271

[51] Int. Cl.$^6$ ...................................................... G11C 7/00
[52] U.S. Cl. ...................... 365/222; 365/203; 365/189.09
[58] Field of Search ..................................... 365/222, 203, 365/189.09, 189.11

[56] References Cited

U.S. PATENT DOCUMENTS 5,748,544  5/1998  Hashimoto ............................... 365/203
5,777,934  7/1998  Lee et al. ................................. 365/203

Primary Examiner—Vu A. Le
Attorney, Agent, or Firm—Jones Volentine, LLP

[57] ABSTRACT

Is disclosed a semiconductor memory device having a self-refresh mode, the semiconductor memory device comprises a bit line precharge voltage generating circuit which is composed of a first voltage generator and a second voltage generator. The bit line precharge voltage generating circuit generates a bit line precharge voltage in response to a control signal indicating a self-refresh mode. During a time period in which the operating voltage is maintained at a first power supply voltage and the control signal is activated, the bit line precharge voltage is maintained at a voltage level between half the second power supply voltage and half the first power supply voltage though the operating voltage in the DRAM is changed from the second power supply voltage level to the first power supply voltage level. A voltage variation (or, a sense margin of a sense amplifier) on a bit line is increased, so that there is prevented a read malfunction for data '1' induced when the refresh operation is performed during the time period.

4 Claims, 5 Drawing Sheets

DYNAMIC RANDOM ACCESS MEMORY DEVICE HAVING A SELF-REFRESH MODE

FIELD OF THE INVENTION

The present invention relates to a semiconductor memory device with a self-refresh mode and, more particularly to a bit line precharge circuit for precharging bit lines of the semiconductor memory device.

BACKGROUND OF THE INVENTION

The density of dynamic random access memories (DRAMs), which are usually used as main memory devices in computer systems, has increased about four-fold every three years, and efforts toward their high speed operation and lower power consumption have successively been made. High speed operation of DRAMs is desired to reduce the operating speed gaps between the DRAM and processors, and especially their lower power consumption is required for portable devices. Examples of DRAMs intended to achieve high speed operation include synchronous DRAMs using a system clock and a rambus DRAM by Rambus, Inc. Also, DRAMs aim at low power consumption for portable devices using batteries, such as portable computers, mobile phones, or the like.

Since data stored in a memory cell of the DRAM disappears (discharges) with the lapse of time, the memory cell data must periodically be recharged. Such operations are commonly referred to as "refresh operations". The refresh operations are typically classified into an ROR refresh, a hidden refresh, a CBR($\overline{CAS}$ before $\overline{RAS}$) refresh, and an extended CBR (ECBR) refresh operation in accordance with the performance manner. The difference between the CBR refresh operation and the ROR refresh operation as mentioned above is that in the ROR refresh operation the word line selection is made by the address given by a controller, but in the CBR refresh operation only a CBR refresh input signal is received from the controller and remaining operations are executed by an on-chip internal circuit. Compared with the ROR refresh operation, the CBR refresh operation has the advantage of lessening the burden of the controller. A latch operation of a row address for selecting a word line is executed by a toggling of a row address strobe signal $\overline{RAS}$.

Recently, a self-refresh operation which still more extends the ECBR refresh operation is widely used. The self-refresh operation reduces to a maximum extent the power consumption in a DRAM device in order to extend the operating time of the computer system using a battery. In case where an access to a DRAM is not performed for a long time, the DRAM enters a self-refresh operation mode and suppresses to a maximum extent the operation of the DRAM to reduce the power consumption of the DRAM. For example, if a laptop computer is used for a word processing work in an airplane, since a constant level of power is not supplied to the computer, the computer used on boarding should be operable for a long time without interruption by the battery installed therein. A very important concern is not the processing speed of the computer, but the extension of time available for use of the computer by suppressing power consumption. That is, it is important how long the usage time of the computer can be extended without loss of data stored in the DRAM. Further, in other systems, and particularly when the DRAM is not accessed, the reduction of the power consumption by the DRAM is very important.

The self-refresh operation of a DRAM is executed in the following manner. Generally, a self-refresh input signal is made up of combination of a CBR and a timer output. When a CBR cycle is set up, a normal operation is halted and a refresh mode begins. Here, word line selection is sequentially made not by an external address but by a counter installed in the interior of a chip. Further, a data output operation to the exterior of the chip is not performed and only a cell data restoring operation in the interior of the chip is performed.

FIG. 1 is a timing diagram showing operating voltage $V_{OP}$ and bit line precharge voltage $V_{BL}$ variation in accordance with execution of the refresh operation of the prior art and the present invention. After a refresh mode is started by the CBR cycle, if the signal $\overline{RAS}$ is not toggled during a given time period (for example, about 100 microsecond), the self-refresh operation begins. In order to reduce the power consumption of a DRAM during the refresh mode, the operating voltage $V_{OP}$ used in the DRAM is lowered to a voltage $V_{RFH}$ level from a first power supply voltage $V_{CC}$ level, as shown in FIG. 1, and then the self-refresh operation is performed. Hereinafter, the voltage $V_{RFH}$ is referred to as a second power supply voltage. And, before exiting the self-refresh mode, the operating voltage $V_{OP}$ is recovered from the second power supply voltage $V_{RFH}$ to the first power supply voltage $V_{CC}$, and one or more refresh cycles are performed during a time period of tA in FIG. 1.

Data '1' is stored in one memory cell of the DRAM by use of the first power supply voltage $V_{CC}$ level during the normal operation and the CBR refresh operation, while the data '1' is stored in the memory cell by use of the second power supply voltage $V_{RFH}$ level during the self-refresh operation. Before the refresh operation is completed, at least one refresh cycle is performed during the time period tA after the operating voltage $V_{OP}$ goes to the second power supply voltage $V_{RFH}$ from the first power supply voltage $V_{CC}$. At this time, there may arise one problem described below in detail.

In general, several hundreds of memory cells each consisting of a storage capacitor and an access transistor are connected to a bit line. Assuming that a bit line loading is about 175 Farad and a loading of one storage capacitor is about 25 Farad. Under this assumption, when one memory cell is selected, charge sharing between the storage capacitor and a bit line connected to the selected memory cell occurs. A voltage level on a bit line previously precharged (typically, half of the first power supply voltage $V_{CC}$, that is, $V_{CC}/2$) is changed due to the charge sharing. A voltage variation $\Delta V_{BL}$ on the bit line is sensed and amplified by a sense amplifier (refer to FIG. 3). The voltage variation $\Delta V_{BL}$ (or, a sense margin of a sense amplifier circuit 150 in FIG. 3) can be expressed by a following equation.

$$\Delta V_{BL} = \frac{25 \text{ Farad}}{25 \text{ Farad} + 175 \text{ Farad}}(V_{CELL} - V_{BL}) \quad (1)$$

Here, the denotation $V_{CELL}$ indicates a voltage corresponding to data stored in the selected memory cell and the denotation $V_{BL}$ indicates a bit line precharge voltage. As well-known in the art, the bit line precharge voltage $V_{BL}$ level corresponds to half of the first power supply voltage $V_{CC}$, that is, $V_{CC}/2$. If data '1' is stored in the memory cell when the first power supply voltage $V_{CC}$ as the operating voltage $V_{OP}$ is supplied, then a voltage level of the data '1' is the first power supply voltage $V_{CC}$ level, but if data '0' is stored therein, then a voltage level of the data '0' is a ground voltage $V_{SS}$ level. Under this assumption that data '1' is stored in the selected memory cell, a voltage variation $\Delta V_{BL}$ on a bit line associated with the memory cell is:

$$\Delta V_{BL} = \frac{1}{8}\left(\frac{V_{CC}}{2}\right) \quad (2)$$

In the former case, a voltage level on a precharged bit line increases by the voltage variation $\Delta V_{BL}$ in equation (2), and in the latter case, the voltage level on the precharged bit line decreases by the voltage variation $\Delta V_{BL}$ in equation (2). Thereafter, the bit line voltage variation $\Delta V_{BL}$, i.e., the difference between the bit line pair associated with the selected memory cell, is detected by a sense amplifier circuit (refer to 150 in FIG. 3).

But, it is one problem of the prior art that read malfunction for data '1' occurs during a refresh operation during a time period tA shwon in FIG. 1. The more increased the difference between the first power supply voltage $V_{CC}$ and the second power supply voltage $V_{RFH}$, the higher the probability of such a read malfunction for data '1'.

As mentioned above, before the refresh operation is performed, data '1' is stored in the selected memory cell using the first power supply voltage $V_{CC}$ level. When the self-refresh operation is executed, the data '1' is restored using the second power supply voltage $V_{RFH}$ level lower than the voltage $V_{CC}$ level. As mentioned above, one or more refresh cycles are performed during the time period tA before existing the refresh mode. At this time, the bit line is precharged to a voltage level corresponding to half of the first power supply voltage $V_{CC}$, and data '1' is restored using the second power supply voltage $V_{RFH}$ level during the self-refresh mode.

Under this condition, if a refresh operation is performed during the time period tA, a sense amplifier may not sense and amplify a voltage difference $\Delta V_{BL}$ between a bit line pair associated with the memory cell in which the data '1' is stored. That is, a voltage variation $\Delta V_{BL}$ of one bit line connected to a storage capacitor through an access transistor in the selected memory cell becomes lower:

$$\Delta V_{BL} = \frac{1}{8}\left(V_{RFH} - \frac{V_{CC}}{2}\right) \quad (3)$$

Because the voltage variation $\Delta V_{BL}$ in equation (3) is lower than that in equation (2), it may not be sensed by the sense amplifier (refer to FIG. 3). This causes the read malfunction for the data '1' during the time period tA. The larger a difference between the first power supply voltage $V_{CC}$ and the second power supply voltage $V_{RFH}$ and the variation of the operating voltage $V_{OP}$, the smaller the bit line voltage variation $\Delta V_{BL}$ (or, the sense margin of a sense amplifier 150 in FIG. 3). It can be understood that this causes a higher possibility of the read malfunction. Referring to FIG. 2, as the second power supply voltage $V_{RFH}$ becomes lower, read fail for data '1' is concentrated in right lower part. To improve this, if the bit line precharge voltage $V_{BL}$ during the normal operation is made lower than that during the self-refresh operation, then there may arise another problem that a sense margin for data '0' is decreased, inducing read malfunction for the data '0'.

SUMMARY OF THE INVENTION

It is therefore an object of the present invention to provide a DRAM device having an improved sense margin at a refresh operation.

In order to attain the above objects, according to an aspect of the present invention, there is provided a dynamic random access memory device having a self-refresh mode. The device comprises at least one pair of bit lines connected to a memory cell array, a equalization circuit for equalizing voltage level on the pair of bit lines at a precharge voltage, a power supply providing section for supplying a first voltage level during a normal mode and a second voltage during the self-refresh mode, respectively, wherein the first voltage level is higher than the second voltage level and a precharge voltage generating circuit responsive to a control signal indicating the self-refresh mode, for generating the precharge voltage using the first or second voltage from the power supply providing section. The precharge voltage generating circuit generates a third voltage of the same voltage level as half the second voltage as the precharge voltage during the self-refresh mode, and generates a fourth voltage between both half the first voltage and the third voltage as the precharge voltage when output from supplying means is changed from the second voltage level to the first voltage level during the self-refresh mode.

In the device according to the invention, the control signal is derived from a Row Address Strobe signal.

In the device according to the invention, the precharge voltage generating circuit comprises an input terminal for receiving the first or second voltage from the power supply providing section, a comparator connected to the input terminal, for comparing a reference voltage and a divided voltage to generate a comparison signal as a comparison result, a driver connected between the input terminal and a node, operated responsive to the comparison signal, a divider connected to the node, for dividing a voltage on the node to generate the divided voltage changing in accordance with an enable/disable state of the control signal and a half voltage generator connected to the node, for generating half the voltage on the node as the precharge voltage.

Furthermore, in the device according to the invention, the divided voltage during the enable state of the control signal is lower than that during the disable state of the control signal.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

A preferred embodiment of the present invention will now be described with reference to the accompanying drawings in detail, in which well-known circuits are shown in block diagram form in order not to obscure the present invention.

Figure 3:
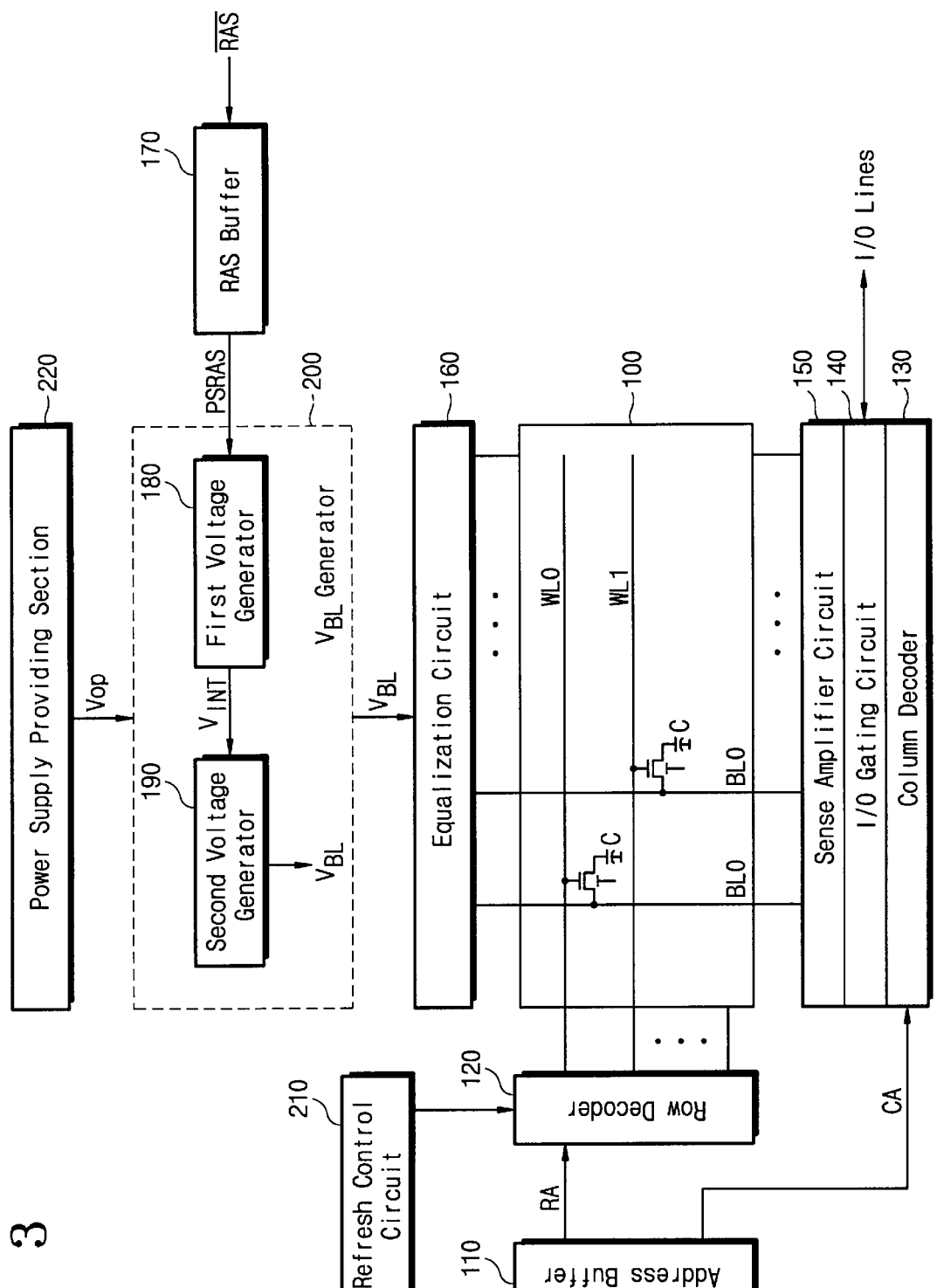
FIG. 3 is a block diagram of a DRAM device in accordance with the present invention.

Referring now to FIG. 3, a novel dynamic random access memory (DRAM) device of the present invention provides a bit line precharge voltage $V_{BL}$ generating circuit 200 which is composed of a first voltage generator 180 and a second voltage generator 190. The circuit 200 generates a bit line precharge voltage $V_{BL}$ in response to a control signal PSRAS indicating a self-refresh mode. The bit line precharge voltage $V_{BL}$ is maintained at half of an operating voltage $V_{OP}$ during the self-refresh mode in which the operating voltage $V_{OP}$ becomes lowered from the first power supply voltage $V_{CC}$ level to the second power supply voltage $V_{RFH}$ level. And, during a time period tA (refer to FIG. 1), the bit line precharge voltage $V_{BL}$ is maintained at a voltage level between half of the second power supply voltage $V_{RFH}$ (i.e., $V_{RFH}/2$) and half of the first power supply voltage $V_{CC}$ (i.e., $V_{CC}/2$) even though the operating voltage $V_{OP}$ of the DRAM is changed from the second power supply voltage $V_{RFH}$ level to the first power supply voltage $V_{CC}$ level. Thus, a voltage variation $\Delta V_{BL}$ (or, a sense margin of a sense amplifier) on a bit line is increased, thereby preventing a read malfunction for data '1' during the time period tA.

Referring again to FIG. 3, a DRAM device in accordance with the present invention is shown in block diagrammatic form. A memory cell array 100 comprises a plurality of memory cells, storage capacitors each of which is connected to a corresponding bit line through an access transistor selected by a corresponding word line. It is obvious to ones skilled in the art that an address buffer 110 is composed of a row address buffer and a column address buffer, although not shown in FIG. 3. At least one memory cell of the memory cell array 100 and at least one pair of bit lines are selected by row and column decoders 120 and 130 receiving corresponding addresses RA and CA from the address buffer 110, respectively. A bit data (logic '1' or logic '0') stored in the selected memory cell is sensed and amplified to corresponding voltage level (the first power supply voltage $V_{CC}$ or the ground voltage $V_{SS}$) by the sense amplifier circuit (FIG. 3, 150). Generally, before a sense and amplification operation for the selected memory cell is performed by the sense amplifier circuit 150, the pair of bit lines are precharged by an equalization circuit 160 to a bit line precharge voltage $V_{BL}$ level supplied from a bit line precharge voltage generating circuit 200. The bit line precharge voltage $V_{BL}$ level is the half level of an operating voltage $V_{OP}$ from a power supply providing section 220. Since the circuits 110 through 160 are well-known to those skilled in the art, their details will be omitted.

Because the DRAM is a volatile memory as described before, data stored in the DRAM is periodically recharged. Such a function is performed by a refresh control circuit 210 in FIG. 3. Although not shown in FIG. 3, the refresh control circuit 210 comprises a refresh timer, a refresh controller and a refresh counter. While a refresh operation is performed, row addresses are sequentially generated by the refresh control circuit 210. As a result, a plurality of word lines in the memory cell array 100 are sequentially enabled and the refresh operation is performed.

A control signal PSRAS is generated from a RAS buffer 170 after a signal $\overline{RAS}$ becomes activated and a predetermined time (e.g., about 100 microseconds) has been elapsed. That is, after a refresh mode is started by a CBR cycle and a time elapse, the control signal PSRAS goes to a high level (e.g., the first power supply voltage $V_{CC}$ level) from a low level (e.g., the ground voltage $V_{SS}$ level). And, after the signal $\overline{RAS}$ goes to the low level from the high level and a predetermined time (e.g., about 70 to 80 microseconds) is elapsed, the signal PSRAS becomes inactivated to the low level, so that the refresh mode is completed.

A power supply providing section 220 presents the first power supply voltage $V_{CC}$ of a predetermined level as an operating voltage $V_{OP}$ to the bit line precharge voltage $V_{BL}$ generating circuit 200 during a normal mode and a refresh mode (e.g., a CBR mode). The section 220 provides a second power supply voltage $V_{RFH}$ to the circuit 200 as the operating voltage $V_{OP}$. The level of second power supply voltage $V_{RFH}$ is lower than that of the first power supply voltage $V_{CC}$.

The bit line precharge voltage $V_{BL}$ generating circuit 200 comprises a first voltage generator 180 and a second voltage generator 190. The first voltage generator 180 receives as the operating voltage $V_{OP}$ from the power supply providing section 220 the first power supply voltage $V_{CC}$ or the second power supply voltage $V_{RFH}$, respectively, and generates a first voltage $V_{INT}$ in response to the control signal PSRAS from the buffer 170. When the first power supply voltage $V_{CC}$ is supplied as the operating voltage $V_{OP}$ and the control signal PSRAS is inactivated, that is, during the normal mode and the CBR mode, the first voltage $V_{INT}$ is maintained constantly at a predetermined voltage level. When the second power supply voltage $V_{RFH}$ or the first power supply voltage $V_{CC}$ is supplied and when the control signal PSRAS is activated, that is, while the self-refresh operation is being performed, the first voltage $V_{INT}$ moves together with the operating voltage $V_{OP}$. The first voltage $V_{INT}$ level during the normal mode and the CBR mode is higher than that during the self-refresh mode. The second voltage generator 190 generates a second voltage $V_{BL}$ corresponding to half the first voltage $V_{INT}$ level as the bit line precharge voltage.

Here, the bit line precharge voltage $V_{BL}$ has a voltage $V_{BL1}$ level (see FIG. 1) corresponding to $V_{RFH}/2$ when the second power supply voltage $V_{RFH}$ is supplied to the circuit 200 as the operating voltage $V_{OP}$ from the power supply providing section 220. =Also, the bit line precharge voltage $V_{BL}$ has a voltage $V_{BL2}$ level between the voltage $V_{BL1}$ (i.e., $V_{RFH}/2$) and $V_{CC}/2$.

Figure 4:
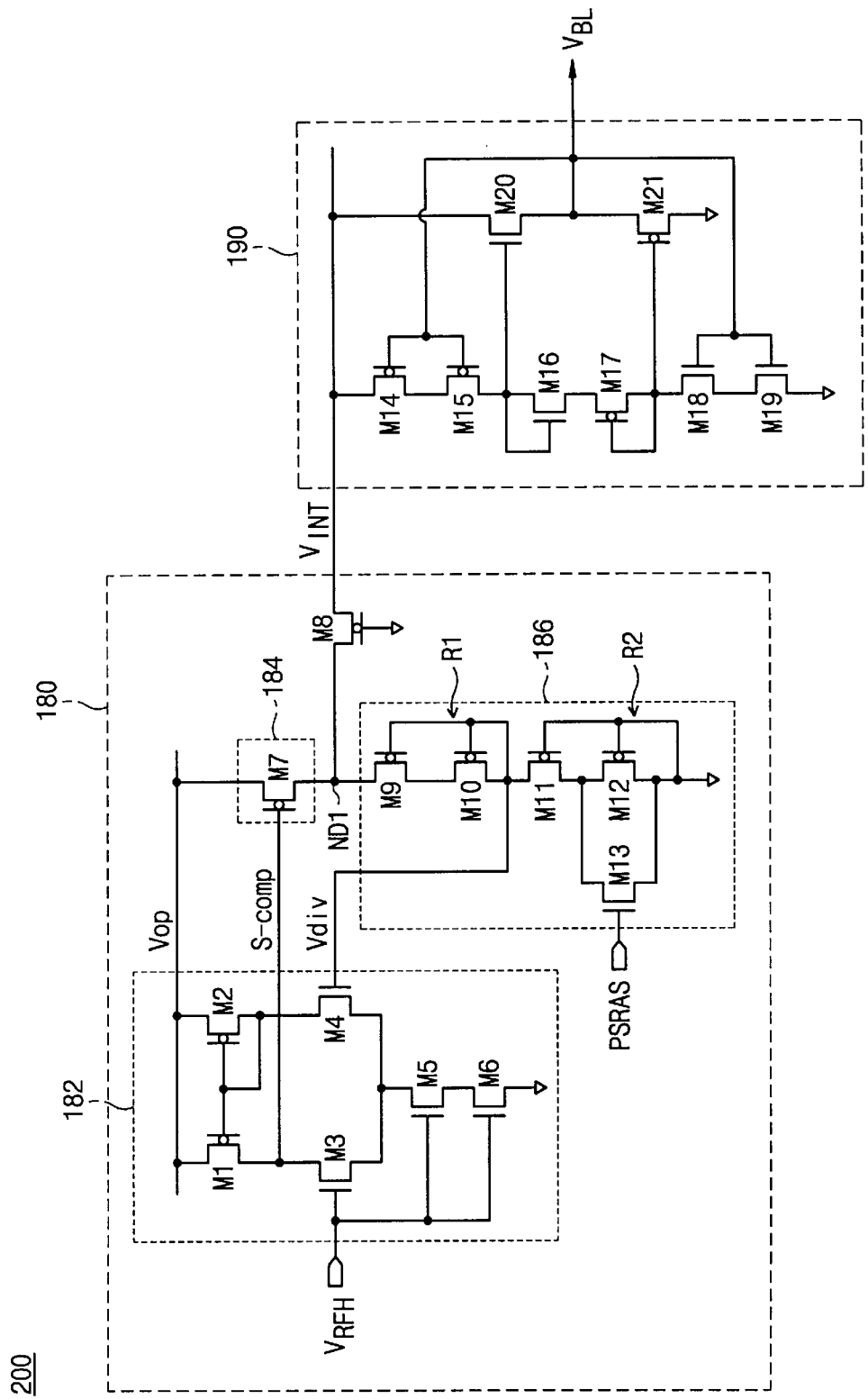
FIG. 4 is a detailed circuit diagram of a bit line precharge voltage generating section in accordance with a preferred embodiment of the present invention.

Referring to FIG. 4, a detailed circuit of the bit line precharge voltage generating circuit 200 is shown. The bit line precharge voltage generating circuit 200 comprises a first voltage generator 180 and a second voltage generator 190. The first voltage generator 180 has a comparator 182, a driver 184 and a divider 186. The comparator 182 compares a reference voltage $V_{REF}$ of a predetermined level and a divided voltage Vdiv from the divider 186 to generate a comparison signal S_comp as a comparison result. The reference voltage $V_{REF}$ is constantly maintained regardless of the operating voltage variation $V_{OP}$. The comparator 182 consists of two PMOS transistors M1 and M2 and four NMOS transistors M3 to M6 connected as shown in FIG. 4.

The driver 184 comprises one PMOS transistor M7 connected between an operating voltage $V_{OP}$ and a node ND1 and switched on/off by the signal S_comp, and the first voltage $V_{INT}$ is output from the node ND1 through a PMOS transistor M8 whose gate is grounded. The operating voltage $V_{OP}$ has $V_{CC}$ level during a normal mode and a refresh mode (i.e., a CBR mode), and it has $V_{RFH}$ level during a self-refresh mode. The divider 186 is connected to the node ND1 and divides a voltage on the node ND1, that is, the first voltage $V_{INT}$, to thereby output the divided voltage Vdiv in response to a control signal PSRAS from a RAS buffer 170. The divider 186 is made up of four PMOS transistors M9 to M12 and one NMOS transistor M13. The transistors M9 and M10 serves as a first resistor R1 and the transistors M11 to M13 serves as a second resistor R2.

As shown in FIG. 4, if the NMOS transistor M13 is turned on or off on the basis of an enable/disable state of the control signal PSRAS, then the ration of the resistors R1 and R2 is changed so that the divided voltage Vdiv level is changed. That is, the divided voltage Vdiv during the enable state (e.g., a logic high level) of the control signal PSRAS is lower than that during the disable state (e.g., a logic low level) of the control signal PSRAS. Therefore, the first voltage $V_{INT}$ during the enable state of the control signal PSRAS has a lower level than that during the disable state of the control signal PSRAS. The second voltage generator 190 consists of four PMOS transistors M14, M15, M17 and M21 and four NMOS transistors M16, M18, M19 and M20 connected as shown in FIG. 4. The second voltage generator 190 is connected to the node ND1 through the PMOS transistor M8 and generates half the first voltage $V_{INT}$ as a bit line precharge voltage $V_{BL}$.

Figure 1:
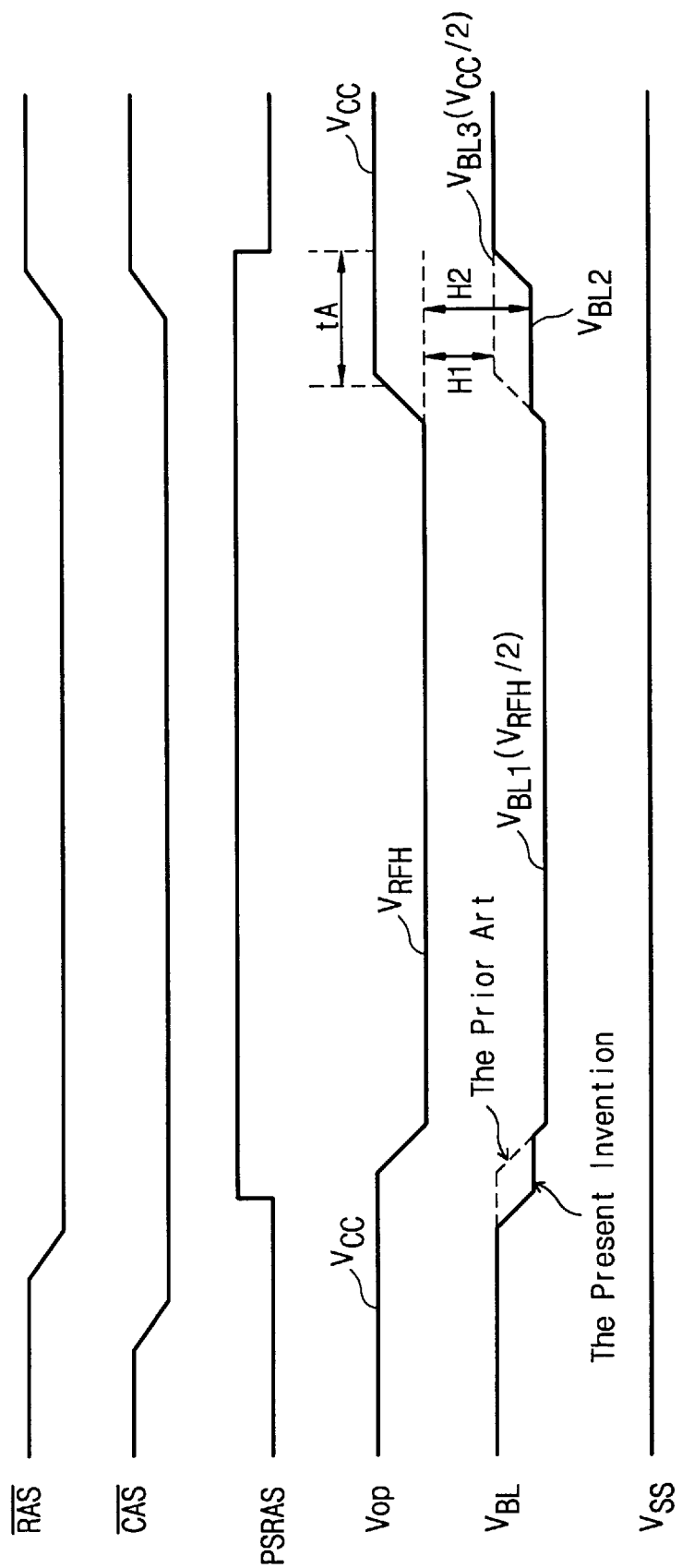
FIG. 1 is a timing diagram for describing operating voltage and bit line precharge voltage variation in accordance with the prior art and the present invention.
Figure 2:
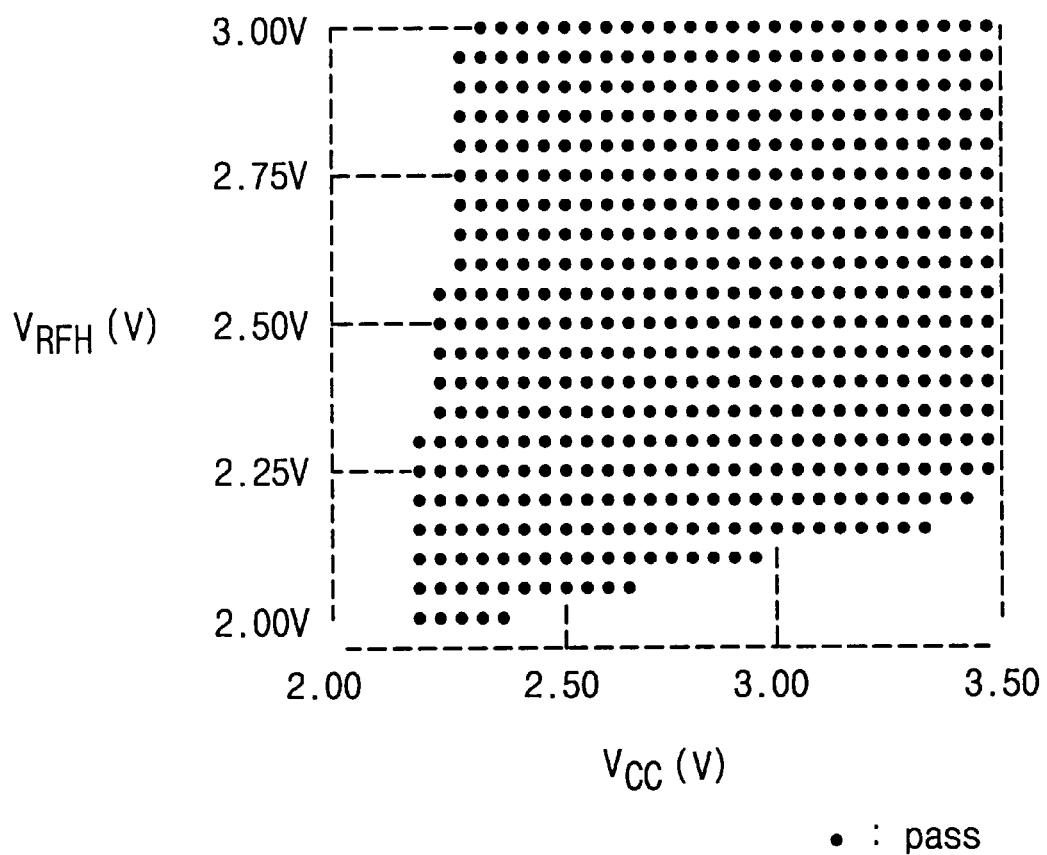
FIG. 2 is a diagram showing a pass/fail inclination in accordance with the operating voltage variation of the prior art.

A refresh operation in accordance with the present invention is described below in detail in reference with FIGS. 1, 3 to 5. After a refresh mode is started by the CBR cycle, if the toggling of the signal $\overline{RAS}$ is not executed during a given time period (e.g., about 100 microseconds), then the self-refresh mode begins, that is, a control signal PSRAS is activated to the high level from the low level as shown in FIG. 1. To reduce a power consumption by the DRAM during the self-refresh operation, the operating voltage $V_{OP}$ used in the DRAM becomes lowered from a first power supply voltage $V_{CC}$ to the second power supply voltage $V_{RFH}$ as shown in FIG. 1, and then the self-refresh operation is performed. During the self-refresh operation, a voltage level corresponding to data '1' is changed from the first power supply voltage $V_{CC}$ level to the second power supply voltage $V_{RFH}$ level. During a given time period, the refresh operation is executed.

And then, Before exit of the self-refresh mode, as mentioned above, at least one or more refresh cycles are performed during a time period tA shown in FIG. 1. The operating voltage $V_{OP}$ is changed from the second power supply voltage $V_{RFH}$ to the first power supply voltage $V_{CC}$, as illustrated in FIG. 1, during the time period tA when the control signal PSRAS continues to be maintained at the enable state.

During the time period tA, the bit line precharge voltage $V_{BL}$ for the prior art is maintained at a voltage $V_{BL3}$ level (that is, $V_{CC}/2$) illustrated by a dot line as shown in FIG. 1. If the refresh operation is executed during the time period tA, a voltage level corresponding to data '1' is the second power supply voltage $V_{RFH}$ level and the bit line precharge voltage $V_{BL}$ level is half the first power supply voltage $V_{CC}$ level. Therefore, a voltage on a precharged bit line connected to a selected memory cell is changed by the equation (3) (a sense margin of a sense amplifier), that is, by H1 in FIG. 1.

On the contrary, the bit line precharge voltage $V_{BL}$ for the present invention is maintained at a voltage $V_{BL2}$ level illustrated by a solid line in FIG. 1. The voltage $V_{BL2}$ is between half the second power supply voltage level (that is, $V_{RFH}/2$) and half the first power supply voltage level (that is, $V_{CC}/2$). Under this condition, a voltage on the precharged bit line connected to the selected memory cell is changed by:

$$\Delta V_{BL} = \frac{1}{8}\left(V_{RFH} - \frac{V_{BL2}}{2}\right) \quad (4)$$

Here, $V_{RFH}$ is a voltage corresponding to data ('1' or '0') stored in a memory cell and $V_{BL2}$ is a bit line precharge voltage. It can be seen that during the time period tA, the voltage variation $\Delta V_{BL}$ (or, a sense margin) of the equation (4) is higher than that of the equation (3).

Figure 5:
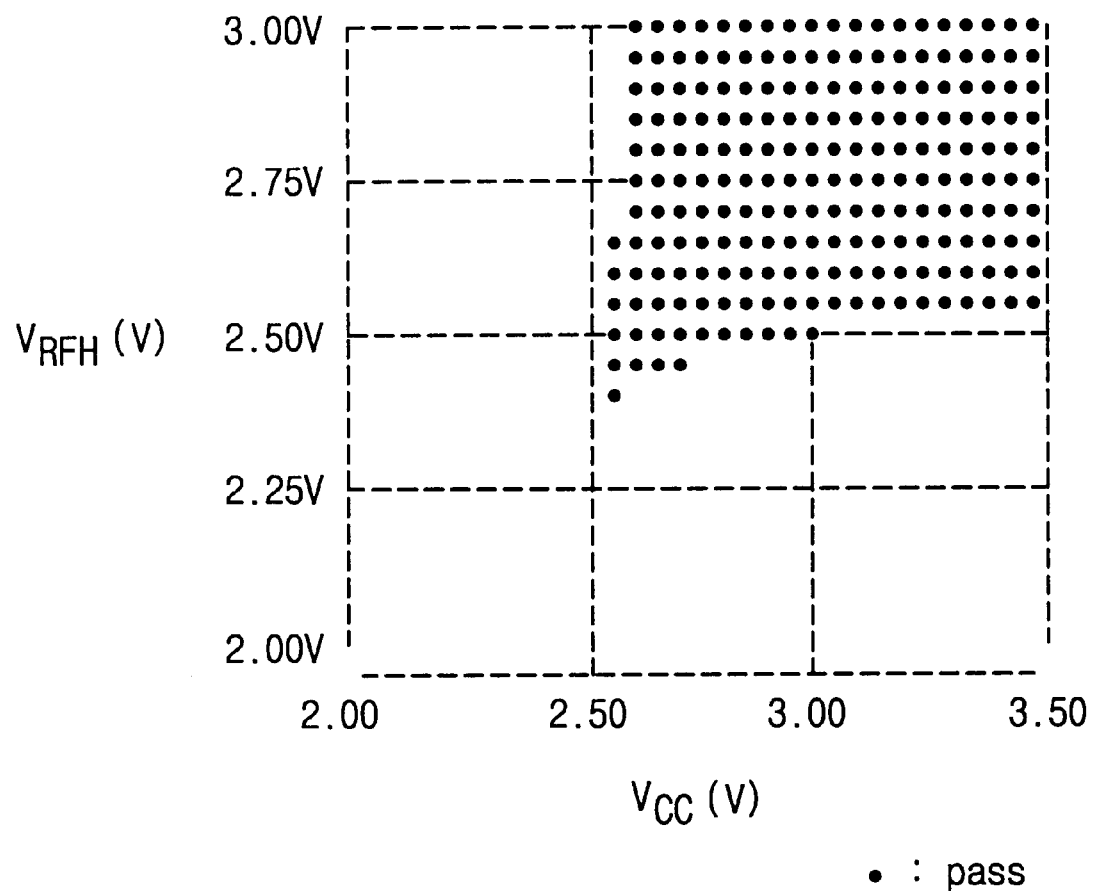
FIG. 5 is a diagram showing a pass/fail inclination in accordance with the operating voltage variation of the present invention.

As described above, the bit line precharge voltage $V_{BL}$ in accordance with the present invention is maintained at the voltage $V_{BL2}$ level during the time period tA. During the time period tA, if the refresh operation is executed, the voltage variation $\Delta V_{BL}$ (corresponding to H2 in FIG. 1) by a charge sharing between a storage capacitor in the selected memory cell and a bit line associated with the selected memory cell in accordance with the present invention is higher than that of the prior art (corresponding to H1 in FIG. 1). As a result, there is improved a sense margin of a sense amplifier during the refresh mode, so that a read malfunction for data '1' can be prevented during the time period tA. As shown in FIG. 5, compared with read fail inclination of the prior art, read fail inclination of the present invention is improved.

While the invention has been described in terms of an exemplary embodiment, it is contemplated that it may be practiced as outlined above with modifications within the spirit and scope of the appended claims.

What is claimed is:

1. A dynamic random access memory device having a self-refresh mode, comprising:

at least one pair of bit lines connected to a memory cell array;

means for equalizing voltage level on the pair of bit lines at a precharge voltage;

means for supplying a first voltage level during a normal mode and a second voltage during the self-refresh mode, respectively, wherein the first voltage level is higher than the second voltage level; and means responsive to a control signal indicating the self-refresh mode, for generating the precharge voltage using the first or second voltage from the supplying means, the generating means generating a third voltage of the same voltage level as half the second voltage as the precharge voltage during the self-refresh mode, and generating a fourth voltage between both half the first voltage and the third voltage as the precharge voltage when output from supplying means is changed from the second voltage level to the first voltage level during the self-refresh mode.

2. The device according to claim 1, wherein the control signal is derived from a Row Address Strobe ($\overline{RAS}$) signal.

3. The device according to claim 1, wherein said generating means comprises:

an input terminal for receiving the first or second voltage from the supplying means;

a comparator connected to the input terminal, for comparing a reference voltage and a divided voltage to generate a comparison signal as a comparison result;

a driver connected between the input terminal and a node, operated responsive to the comparison signal;

a divider connected to the node, for dividing a voltage on the node to generate the divided voltage changing in accordance with an enable/disable state of the control signal; and a half voltage generator connected to the node, for generating half the voltage on the node as the precharge voltage.

4. The device according to claim 3, wherein said divided voltage during the enable state of the control signal is lower than that during the disable state of the control signal.

* * * * *